United States Patent [19]

Coldren

[11] Patent Number: 4,608,697
[45] Date of Patent: Aug. 26, 1986

[54] SPECTRAL CONTROL ARRANGEMENT FOR COUPLED CAVITY LASER

[75] Inventor: Larry A. Coldren, Holmdel, N.J.

[73] Assignee: AT&T Bell Laboratories, Murray Hill, N.J.

[21] Appl. No.: 504,829

[22] Filed: Jun. 16, 1983

Related U.S. Application Data

[63] Continuation-in-part of Ser. No. 483,513, Apr. 11, 1983, abandoned.

[51] Int. Cl.$^4$ .............................................. H01S 3/19
[52] U.S. Cl. ....................................... 372/50; 372/19; 372/32; 372/92
[58] Field of Search ................. 372/44, 50, 18, 19, 372/26, 29, 32, 20, 92; 250/205; 455/609

[56] References Cited

U.S. PATENT DOCUMENTS 4,284,963 8/1981 Allen, Jr. et al. .................. 331/94.5

OTHER PUBLICATIONS

IEEE J. of Quantum Electronics, vol. QE-16, No. 9, Sep. 1980, "Amplification in Cleaved-Substrate Lasers" by Michael B. Chang et al., pp. 997-1001.
Applied Physics Letters, vol. 38, No. 5, Mar. 1, 1981, "Monolithic Two-Section GaInAsP/InP Active-Optical-Resonator Devices Formed by Reactive Ion Etching" by L. A. Coldren et al., pp. 315-317.
IEEE J. of Quantum Electronics, vol. QE-18, No. 10, Oct. 1982, "Etched Mirror and Groove-Coupled GaInAsP/InP Laser Devices for Integrated Optics" by L. A. Coldren et al., pp. 1679-1688.
Electronics Letters, vol. 18, No. 21, Oct. 14, 1982, "Generation of Single-Longitudinal-Mode Subnanosecond Light Pulses by High-Speed Current Modulation of Monolithic Two—Section Semiconductor Lasers" by K. J. Ebeling et al., pp. 901-902.
Electronics Letters, vol. 16, No. 19, Sep. 11, 1980, "Wavelength Sensed Mode Control of Semiconductor Lasers" by D. J. Malyon et al., pp. 744-746.
Electronics Letters, vol. 18, No. 25, Dec. 9, 1982, "Simple Spectral Control Technique for External Cavity Laser Transmitters" by K. R. Preston, pp. 1092-1094.

*Primary Examiner*—James W. Davie
*Attorney, Agent, or Firm*—Richard D. Laumann

[57] ABSTRACT

Control circuits stabilize and maintain coupled-cavity lasers in a single longitudinal mode. The laser is electrically connected and mutually and optically coupled to a control means responsive to a light output signal from the laser for controlling the laser by generating a control signal to the laser to produce single longitudinal mode output. The single mode output is maintained even during high speed modulation in which the current or ambient conditions vary.

36 Claims, 12 Drawing Figures

SPECTRAL CONTROL ARRANGEMENT FOR COUPLED CAVITY LASER

CROSS-REFERENCE TO RELATED APPLICATION

This application is a continuation-in-part of my co-pending application, Ser. No. 483,513, filed Apr. 11, 1983, now abandoned.

TECHNICAL FIELD

This invention is related to semiconductor lasers and, more particularly, to spectral control of coupled-cavity lasers.

BACKGROUND OF THE INVENTION

Wideband communication systems operating in the gigahertz region are considered to be an applicable environment for optical fibers and, of course, light sources. At these high frequencies, it is important for the fibers and sources to be compatible in order to reduce dispersion and coupling losses. Compatibility is improved and fiber dispersion loss is reduced by operating each light source in a single mode to produce a narrow spectral output, that is, an output substantially at a single wavelength. Single mode is generally understood to mean single longitudinal mode.

In order to achieve single longitudinal mode behavior for light sources and, particularly, for lasers, at least one important type of laser has been developed, namely, the coupled-cavity semiconductor laser. The coupled-cavity semiconductor laser comprises multi-section (two or more sections) coupled-cavity structures which are realized as several coupled active semiconductor cavity sections. See, for example, L. A. Coldren et al., Appl. Phys. Lett., Vol. 38, pp. 315–317 (1981); L. A. Coldren et al., IEEE J. of Quantum Electronics, Vol. QE-18, No. 10, pp. 1679–1688 (1982); K. Ebeling et al., Elect. Lett., Vol. 18, No. 21, pp. 901–902 (1982); M. B. Chang et al., IEEE J. of Quantum Electronics, Vol. QE-16, No. 9, pp. 997–1001 (1980); and U.S. Pat. No. 4,284,963 issued to L. Allen, Jr. et al. (August 1981).

For single longitudinal mode operation to occur, the individual cavity sections must be tuned to a selected longitudinal mode of the coupled-cavity laser. However, since the wavelengths of the longitudinal modes are affected by temperature and modulation bias current as well as by aging of the semiconductor material, the single longitudinal mode condition is not likely to be stable over a range of modulation or temperature conditions. As a result of this instability, multiple longitudinal modes are expected to appear in the light output from the coupled-cavity laser. Hence, it is important to control the coupled-cavity laser so as to provide substantially single longitudinal mode operation over extended periods of time despite the effects of modulation or temperature variations or the like.

SUMMARY OF THE INVENTION

Stabilization and control of a laser is provided in accordance with the present invention in which a semiconductor heterostructure laser is electrically connected and mutually and optically coupled to a control means responsive to a light output signal from the laser for controlling the laser to generate a single longitudinal mode output as high-speed modulation currents or ambient conditions such as temperature vary.

In one embodiment of the invention, longitudinal mode control is enhanced by a circuit which adjusts the length of an intercavity gap of a coupled-cavity laser.

BRIEF DESCRIPTION OF THE DRAWINGS

A more complete understanding of the invention may be obtained by reading the following description of several illustrative embodiments of the invention in conjunction with the appended drawing in which.

DETAILED DESCRIPTION

Figure 1:
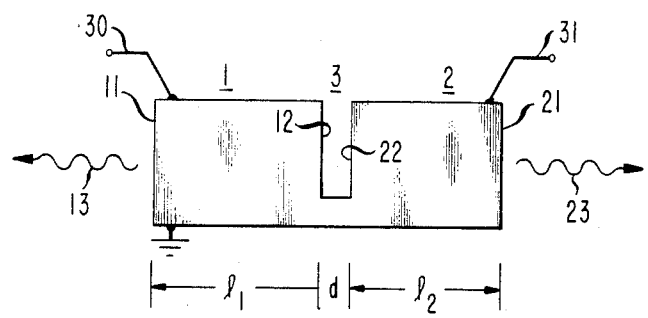
FIG. 1 shows a generalized diagram of a coupled-cavity semiconductor laser having two cavity sections.

FIG. 1 shows a diagram of a coupled-cavity semiconductor laser having two heterostructure sections, namely, section 1 having length $l_1$ and section 2 having length $l_2$. Each section is adapted for electronic control of the laser output spectrum via a terminal electrode attached to a longitudinal stripe (not shown) in each individual heterostructure section. Terminal electrode 30 contacts a stripe in section 1 and terminal electrode 31 contacts a stripe in section 2. Sections 1 and 2 are in common electrical contact through a substrate region which is not depicted in detail in FIG. 1. End mirror facets 11 and 21 are formed on opposite ends of sections 1 and 2, respectively, by cleaving or etching. For illustrative purposes only, light output 13 is shown exiting the laser through mirror facet 11 of section 1 and light output 23 is shown exiting through mirror facet 21 of section 2.

Each of the heterostructure sections is separated by a small gap 3 of length d. Gap 3 is created between sections 1 and 2 by etching or cleaving a monolithic heterostructure, for example, to form gap mirror facets 12 and 22 on sections 1 and 2, respectively. Etching and cleaving techniques for fabricating coupled-cavity semiconductor lasers are described in above-cited articles by Coldren et al. and Chang et al.

Gap 3 provides both electrical isolation of section 1 from section 2 and optical coupling of the sections through mirror facets 12 and 22. The degree of electrical isolation is related to the depth of the gap 3. A shallow gap affords substantially less isolation than a deep gap or even a gap which extends completely through all of the heterostructure layers of the sections. Electrical isolation is important to the coupled-cavity laser because it allows sections 1 and 2 to be electrically biased separate from one another. Length d of gap 3 also affects the degree of electrical isolation as well as the degree of optical coupling between the cavities. Gap length d is typically chosen to be less than $10\lambda$ because of diffraction losses in gap 3 where $\lambda$ is the output wavelength of the laser. For reasons to be presented below, the desired gap length d is related to the output wavelength of the laser as $d \sim m\lambda/2$, where m is greater than zero, and m is a number in the neighborhood of an integer, that is, $m>0$ and $m=i+\epsilon$, for $i=0,1,2,\ldots$ and $-0.25<\epsilon<0.25$. Gap length d must be finite and not equal to zero in order that the gap appear to be an optical discontinuity.

While the gap length is now realized to be important for achieving efficient optical coupling between sections 1 and 2, it should also be observed that coupling is enhanced by requiring substantially collinear alignment of the longitudinal stripes of sections 1 and 2 and by requiring substantially coplanar alignment of active or light guiding layers of sections 1 and 2.

Sections 1 and 2 each form a semiconductor resonant cavity. The resonant cavity formed in section 1 includes mirror facets 11 and 12, whereas the resonant cavity formed in section 2 includes mirror facets 21 and 22. It should be noted that gap 3 is also an resonant cavity formed between mirror facets 12 and 22.

In general, semiconductor layers of this laser are epitaxially grown and substantially matched in lattice constants relative to each other. Individual layers of the laser are comprised of compound semiconductor materials from Group III-V or Group II-VI. For example, a heterostructure may be made by growing alternating layers of InP and InGaAsP. Stripe geometry devices are adaptable as coupled-cavity lasers. Well-known stripe geometry devices include buried heterostructure lasers, v-groove or buried crescent lasers, and ridge waveguide lasers. These laser devices can be either index guided or gain guided structures although it is desirable to have an optical waveguide exhibiting a single transverse mode. Additionally, the layer structures of sections 1 and 2 may be different.

Proper design and fabrication of the coupled-cavity device, as shown in FIG. 1, as well as other coupled-cavity laser devices, depend upon an understanding of the transmission and reflection properties of gap 3 as well as expected net cavity longitudinal mode spectrum resulting from mutual optical coupling among the cavity sections. Wave scattering theory gives an accurate and physically intuitive means for studying and predicting these properties. The following paragraphs provide a basis for understanding these properties prior to describing the embodiments shown in the remaining FIGURES.

For gap 3 bounded by mirror facets 12 and 22, which have substantially identical optical properties, two complex wave scattering parameters define the transmission and reflection properties of gap 3. These parameters are net reflection $S_{11}$ and net transmission $S_{12}$. Assuming a plane-parallel gap of length d, a single facet reflectivity for the guided mode of $\pm r_d$, and amplitude transmission factors of t and t' to account for diffraction and mode reexcitation loss for a single pass or round trip in gap 3, respectively, the net reflection $S_{11}$ is obtained as, $$S_{11} = r_d - \frac{r_d t'(1 - r_d^2)}{1 - r_d^2 t'}, \tag{1}$$

and the net transmission $S_{12}$ is obtained as, $$S_{12} = \frac{t(1 - r_d^2)}{1 - r_d^2 t'}. \tag{2}$$

From equations (1) and (2), it is clear that gap 3 is also a resonant cavity, so that the two section coupled-cavity laser really has three cavity sections. Thus, gap amplitude and phase can be controlled independently by proper design of gap 3. The amplitude transmission factors t and t', for propagation lengths d and 2d, respectively, are calculated neglecting diffraction in the substrate plane (wide slab approximation) and using Gaussian diffraction perpendicular to the substrate plane. These approximations lead to the following relations:

$$t(d) = [2w_0 w(d)/[w^2(d) + w_0^2]]^{\frac{1}{2}} e^{-j\beta d} \tag{3}$$

where $t=t(d)$, $t'=t(2d)$, $w^2(d)=w_0^2[1+(\lambda d/\pi w_0^2)^2]$, $\beta=2\pi/\lambda$ is the propagation constant in the groove, and $w_0 \sim 0.5h + 0.04\sqrt{\lambda/h}$ is an effective Gaussian mode half-width for a quaternary active layer of thickness h cladded by InP, for example.

Mode structure of a two section device is calculated utilizing linear analysis where uniform waveguiding is assumed in the transverse directions. A transfer function, $H(\lambda)$, for the device is obtained as follows:

$$H(\lambda) = \frac{t_1 t_2 S_{12}[(1 - r_1^2)(1 - r_2^2)]^{\frac{1}{2}}}{1 - (S_{12}^2 - S_{11}^2) r_1 r_2 t_1^2 t_2^2 - S_{11}(r_1 t_1^2 + r_2 t_2^2)}, \tag{4}$$

where $r_1$ is the amplitude reflectivity of mirror facet 11, $r_2$ is the amplitude reflectivity of mirror facet 21, $t_1 = e^{-jB_1 l_1}$ and $t_2 = e^{-jB_2 l_2}$ are the one-pass cavity transmission factors for sections 1 and 2, respectively, in which the complex propagation constant $B_i$ is defined as, $$B_i = \beta_i - j\alpha_i/2 \tag{5}$$

and $\beta_i = 2\pi n_i/\lambda_{0i}$ and $\alpha_i$ are the incremental propagation phase and power gain constants for $i=1, 2$. $n_1$ is the effective index of refraction for section 1 and $n_2$ is the effective index of refraction for section 2. Transfer function $H(\lambda)$ in equation (4) represents the response of the coupled-cavity laser below threshold optical power levels before saturation effects occur.

In many cases section 2 can be treated as an active etalon modulating the loss of the Fabry-Perot (FP) modes in section 1 via an equivalent mirror which combines the effects of section 2 and intercavity gap 3. In a general coupled-cavity laser, the light being supplied to a mode in section 1 through mirror facet 12 is composed of filtered light that originated in section 1, $\alpha_1 R(\lambda)$, plus some additional light from external sources, $f(N_2)$. For all cases where $f(N_2) << \alpha_1 R(\lambda)$, the structures outside of section 1 can be said to comprise an effective mirror of reflectivity $R(\lambda)$. If linearity can be assumed, $$R(\lambda) = S_{11} + \frac{S_{12}^2 t_2^2 r_2}{1 - r_2 S_{11} t_2^2}. \quad (6)$$

The phase of $R(\lambda)$, $\phi_R$, determines the Fabry-Perot mode shift $\lambda_{FP} - \lambda_{FP1}$ according to the resonant condition, $$4\pi \frac{n_1 l_1}{\lambda_{FP}} - \phi_R(\lambda) = 2\pi M_1, \quad (7)$$

where $M_1$ is the mode number, $\lambda_{FP}$ is a Fabry-Perot mode wavelength, and $\lambda_{FP1}$ is a Fabry-Perot mode wavelength for section 1 defined with $\phi_R(\lambda) = 0$. The magnitude of $R(\lambda)$ determines the corresponding mirror loss envelope $$\alpha_R(\lambda) = \frac{2}{l_1} \ln \frac{1}{|r_1| |R(\lambda)|} \quad (8)$$

Clearly, the maxima of $|R(\lambda)|$ provide the minima in $\alpha_R(\lambda)$ where the Fabry-Perot modes will be enhanced. The quality of this enhancement and the degree of discrimination against adjacent Fabry-Perot modes depends upon the quality or finesse of $|R(\lambda)|$ near its maximum. The maximum finesse of $R(\lambda)$ is near the resonance of the second term in equation (6) which represents the feedback from section 2. $|R(\lambda)|$ is a maximum if the two terms in equation (6) add, or where $S_{12}^2$ has the same phase as $S_{11}^2$. For gap 3 as shown in FIG. 1, the optimum situation corresponds to gap length d being an even number of quarter wavelengths of the optical output signal. That is, $$d = \frac{\lambda}{4} 2M_g, M_g = 0,1,2 \ldots \quad (9)$$

Figure 2:
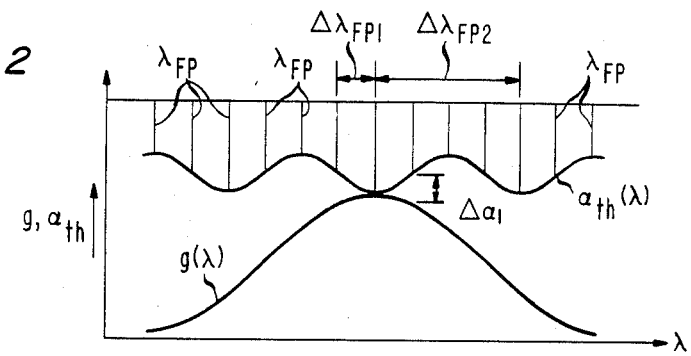
FIG. 2 depicts graphically a material gain envelope, a composite loss or threshold gain envelope and the Fabry-Perot mode locations for the laser shown in FIG. 1.

FIG. 2 is a simplified diagram which illustrates several basic parameters of the coupled-cavity laser of FIG. 1 for section lengths $l_1 \gg l_2$. These parameters are Fabry-Perot mode locations, $\lambda_{FP}$; loss or threshold gain envelope, $\alpha_{th}(\lambda)$; and material gain profile, $g(\lambda)$.

For section lengths $l_1 \gg l_2$, the loss envelope $\alpha_{th}(\lambda)$ is equal to the mirror loss envelope $\alpha_R(\lambda)$ as shown. The period of the loss envelope is $\Delta\lambda_{FP2}$ as shown in FIG. 2, which is equal to $\lambda^2/2n_2 l_2$. In terms of the Fabry-Perot modes of the laser, $\lambda_{FP1}$ for section 1 and $\lambda_{FP2}$ for section 2, section 2 acts as a weak etalon filter modulating the equivalent mirror loss in section 1 via the corresponding mirror loss envelope $\alpha_R(\lambda)$. There is very little mode pulling exerted by the Fabry-Perot modes of section 2. The Fabry-Perot mode spacing $\Delta\lambda_{FP}$ for the coupled-cavities is approximately equal to the mode spacing for section 1, $\Delta\lambda_{FP1}$ provided that the first term of $R(\lambda)$ is greater than the second term.

For section lengths $l_2 > l_1/2$ through $l_1 \sim l_2$, whichwill be referred to hereinafter as substantially equal section lengths, the loss envelope $\alpha_{th}(\lambda)$ is the result of the Fabry-Perot modes $\lambda_{FP}$ beating against the corresponding mirror loss envelope $\alpha_R(\lambda)$. The period of this loss envelope is equal to $\lambda^2/2(n_1 l_1 - n_2 l_2)$. Again, the coupled Fabry-Perot mode spacing $\Delta\lambda_{FP}$ is approximately equal to the mode spacing for section 1, $\Delta\lambda_{FP1}$.

Section lengths $l_1$ and $l_2$ are both important for achieving optimum control and suppression of unwanted longitudinal modes in the light output from the coupled-cavity laser. This can be used understood by realizing that the section lengths, individually and in combination, affect the loss envelope $\alpha_{th}(\lambda)$ and the loss margin of the adjacent mode $\Delta\alpha_1$. For example, the section lengths $l_1$ and $l_2$ should be chosen appropriately so that the period of the loss envelope $\alpha_{th}(\lambda)$ is large enough to ensure that reinforced modes other than the single main mode do not appear within the bandwidth of the material gain profile $g(\lambda)$. On the other hand, the section lengths $l_1$ and $l_2$ should be properly chosen so that the period of the loss envelope $\alpha_{th}(\lambda)$ is sufficiently small to obtain a particular loss margin $\Delta\alpha_1$.

For InGaAsP/InP heterostructure lasers, the period of the loss envelope $\alpha_{th}(\lambda)$ is preferably between 60 and 250 angstroms. In order to achieve this range for the period of the loss envelope $\alpha_{th}(\lambda)$ when the section lengths are substantially unequal ($l_1 \gg l_2$), $l_2$ should be less than or equal to 40 microns and a maximum member of modes in one period of the loss envelope $\alpha_{th}(\lambda)$ should preferably be less than or equal to 20, where $l_1/l_2 \leq 20$. In order to achieve a similar result when the section lengths are substantially equal ($l_1 \sim l_2$), the difference of the section lengths ($l_1 - l_2$) should be less than or equal to 40 microns and a maximum number of modes in one period of the loss envelope $\alpha_{th}(\lambda)$ should preferably be less than or equal to 20, where $[l_1/(l_1 - l_2)] \leq 20$.

For the device shown in FIG. 1, it is generally necessary to make small adjustments in optical lengths $n_1 l_1$ or $n_2 l_2$ or in gap length d in order to obtain optimum discrimination against modes and thereafter maintain sufficient control over the laser output spectrum to generate a single longitudinal mode under high speed modulation. Typically, it is necessary to align a minimum in loss envelope $\alpha_{th}(\lambda)$ with a desired Fabry-Perot mode $\lambda_{FP}$ and, then, maintain arbitrary section lengths by controllably varying the refractive index of a particular section with injected current in that section. Alternatively, an electro-optic effect can be used to vary the refractive index. One such electro-optic effect has been demonstrated by F. Reinhart et al. in Appl. Phys. Lett., Vol. 27, pp. 532-534 (1975).

A wavelength shift of $\Delta\lambda_s$ by the Fabry-Perot mode locations, $\lambda_{FP}$, or by the minimum of the loss envelope, $\alpha_{th}(\lambda)$, to an adjacent mode for substantially unequal length sections ($l_1 \gg l_2$) is accomplished by an optical length shift for section 1 by $$\Delta(n_1 l_1) = \lambda/2, \quad (10)$$

to shift the Fabry-Perot mode locations because $$\Delta\lambda_s = \Delta\lambda_{FP1} = \frac{\lambda^2}{2n_1 l_1} \quad (11)$$

or an optical length shift for section 2 by $$\Delta(n_2 l_2) = \frac{\lambda}{2} \frac{n_2 l_2}{n_1 l_1} \quad (12)$$

to shift the loss envelope because $$\Delta\lambda_s = \Delta\lambda_{FP2} \frac{n_2 l_2}{n_1 l_1} = \frac{\lambda^2}{2n_2 l_2} \frac{n_2 l_2}{n_1 l_1}. \quad (13)$$

For substantially equal section lengths ($l_1 \sim l_2$), this is accomplished by an optical length shift in section 1 by $$\Delta(n_1 l_1) = \frac{\lambda}{2} \frac{n_1 l_1 - n_2 l_2}{n_2 l_2} \tag{14}$$

to shift the Fabry-Perot mode locations because $$\Delta\lambda_s = \Delta\lambda_{FP1} \frac{n_1 l_1 - n_2 l_2}{n_2 l_2} \tag{15}$$

or by an optical path length shift in section 2 by $$\Delta(n_2 l_2) = \frac{\lambda}{2} \frac{n_1 l_1 - n_2 l_2}{n_1 l_1} \tag{16}$$

to shift the loss envelope because $$\Delta\lambda_s = \Delta\lambda_{FP2} \frac{n_1 l_1 - n_2 l_2}{n_1 l_1} \tag{17}$$

The above equations also show that if the relation, $$\Delta(n_1 l_1)/n_1 l_1 = \Delta(n_2 l_2)/n_2 l_2, \tag{18}$$

is satisfied, then both the Fabry-Perot modes and the loss envelope $\alpha_{th}(\lambda)$ shift together, so that no mode hop or degradation of loss margin $\Delta\alpha_1$ occurs. This latter observation relates directly to temperature stability since equation (18) will naturally tend to be satisfied below threshold with similar input current densities. However, for one section biased above threshold and the other section biased below threshold, the refractive indices for sections 1 and 2 change by different amounts in response to similar temperature variations thereby indicating a need for compensation. For direct pulse modulation of the injection current, equation (18) also must be approximately satisfied to avoid mode hopping during the on/off transients of the modulation current. This generally implies that it is desirable to apply at least a portion of the modulation signal to sections 1 and 2 simultaneously to avoid such mode hopping during modulation and thereby maintain a single longitudinal mode.

Equations 10–17 show the relationship between optical path length changes $\Delta(nl)$ and shifts of either the loss envelope or the Fabry-Perot mode wavelengths. As a result of these optical path length changes, it is possible to cause the wavelength of the output light spectrum to move or hop to an adjacent mode. In order to obtain a shift of the wavelength of the output light signal by an amount larger or smaller than the Fabry-Perot mode spacing, it is clear that a proportionately larger or smaller optical path length change is required.

Equations 10–17 also show that when the section lengths are substantially unequal ($l_1 >> l_2$) the coupled cavity laser is more stable than when the section lengths are substantially equal. In other words, when the section lengths are substantially equal, the coupled cavity laser is more easily turned or adjusted because the wavelength shift $\Delta\lambda_s$ required for a mode shift is smaller than the shift required when the section lengths are substantially unequal.

From equations 10–17 and the fact that the index of refraction for each section is dependent upon the input current to that section, it is possible to determine the change in input current required to adjust the index of refraction at each section of the coupled cavity laser in order to (1) move the Fabry-Perot wavelength to fall at a desired minimum of the loss envelope, (2) move a minimum of the loss envelope to fall at a desired Fabry-Perot mode wavelength, (3) move both the Fabry-Perot mode wavelengths and a minimum of the loss envelope so that coincidence of both occurs at the maximum of the material gain profile, (4) move both the Fabry-Perot mode wavelengths and a minimum of the loss envelope so that coincidence of both is maintained as the laser is modulated in frequency (wavelength sweeping), or (5) move a minimum of the loss envelope and the Fabry-Perot mode wavelength in any other prescribed manner. These capabilities are useful for stabilizing and controlling the light output from the laser so that a desired single longitudinal mode, i.e., single wavelength, is produced despite environmental changes. Equally as important, these capabilities can be used to provide a continuous (FM) or discrete (FSK) frequency modulation. For continuous frequency modulation, the wavelength of the single longitudinal mode output by the laser is continually shifted in response to a modulation signal. That is, both refractive indices $n_1$ and $n_2$ are changed while equation 18 is satisfied. For discrete frequency modulation, the modulation signal supplied to the laser is tailored to cause the wavelength of the light output from the laser to hop between different single longitudinal modes.

An additional feature of this invention permits the compensation of chirping which arises because of index changes in the laser from modulation. Under modulation conditions, the laser in FIG. 1 normally experiences wavelength chirping because the on/off characteristics of the modulation current varies the refractive indices of the laser. This chirping can be substantially eliminated by changing the phase, $\phi_R$, of the effective mirror reflectivity by an amount $\Delta\phi_R$. In order to maintain a fixed Fabry-Perot mode location $\Delta_{FP}$ and a mode number $M_1$ of section 1, it is required from equation (7) that $$\Delta\phi_R = \frac{4\pi l_1}{\lambda_{FP}} \Delta n_1, \tag{19}$$

where $\Delta n_1$ is the shift in the refractive index for section 1. Assuming section 2 is biased near threshold and that $\beta_2 l_2 \sim 2\pi M_2$, it can be shown from equation (6) that $$\Delta(n_2 l_2) \sim \frac{1}{2} l_1 (1 - r_2 S_{11} e^{\alpha_2 l_2}) \Delta n_1. \tag{20}$$

Since this equation violates equation (18), single longitudinal mode chirp compensation is limited to small variations of optical length for section 2, $n_2 l_2$, to avoid mode hopping.

In view of the foregoing description concerning the theory for spectral control of a coupled-cavity laser, there exists a desired class of control circuits which can be developed to produce a wavlength shift in the loss envelope $\alpha_{th}(\lambda)$ or a wavelength shift of the Fabry-Perot mode locations $\lambda_{FP}$. Several of these circuits are shown in FIGS. 3 through 9.

Figure 3:
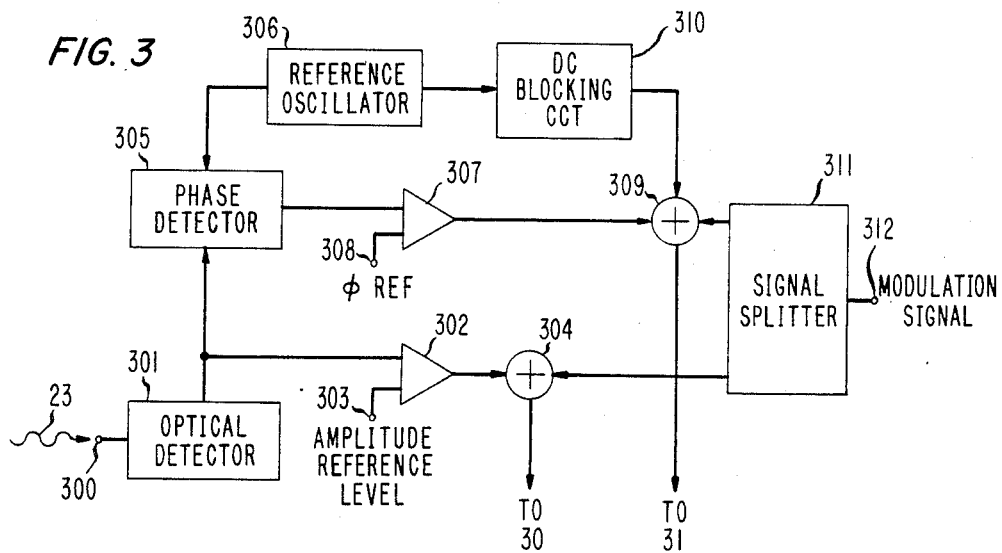
FIGS. 3, 4 and 6 illustrate exemplary circuits for controlling the coupled-cavity semiconductor laser of FIG. 1 in accordance with the principles of this invention.

FIG. 3 shows a feedback control circuit capable of adjusting the gain and refractive index for an individual section of the laser (FIG. 1) via an applied current. The circuit in FIG. 3 is optically coupled to the laser at either end mirror facet. For illustrative purposes, the circuit is shown coupled to end mirror facet 21 of section 2. Hence, light output 23 is input to optical fiber input terminal 300.

The feedback control circuit of FIG. 3 includes two circuit paths: a first circuit path comprising optical detector 301, amplifiers 302, summer 304 and signal splitter 311 for controllably adjusting gain of section 1; and a second circuit path comprising optical detector 301, phase detector 305, reference oscillator 306, amplifier 307, summer 309, dc blocking circuit 310 and signal splitter 311 for controllably adjusting the refractive index of section 2.

In the first circuit path, optical detector 301 responds to the light signal input at terminal 300 to generate a photocurrent output. The photocurrent is compared to the amplitude reference level, a dc signal, at terminal 303 of amplifier 302. An error or difference signal is generated by amplifier 302 and then added in summer 304 to a modulation signal output from signal splitter 311 to control the bias current to section 1 of the coupled-cavity laser. The time constant for this path is at least longer than one period of the signal from reference oscillator 306.

Signal splitter 311 receives a modulation signal applied to terminal 312 and divides the modulation signal along two internal paths, each internal path providing a predetermined portion of the received modulation signal to the corresponding laser section. The predetermined portions of the modulation signal on the two internal paths are selected relative to each other to maintain a single longitudinal mode during modulation. For high speed modulation, signal splitter 311 can be realized by an adjustable active or passive divider circuit comprised of at least one resistor. For electronic adjustability, p-i-n diodes may be used for example.

In the second circuit path, the photocurrent from optical detector 301 is supplied to phase detector 305 along with a small amplitude, low frequency signal from reference oscillator 306. Phase detector 305 generates an output signal which is proportional to the phase of the laser output relative to the phase of reference oscillator 306. The laser output phase varies in response to the refractive index variations of section 2 of the laser. The refractive index of section 2 is dithered in response to the small amplitude, low frequency signal generated by reference oscillator 306 and applied to section 2 via dc blocking circuit 310 and summer 309. A desirable frequency range for the signal from reference oscillator 306 is 100 Hz to 10 kHz. The output signal from phase detector 305 is amplified with respect to a phase reference level $\phi_{REF}$ by amplifier 307. In turn, the output from amplifier 307 is supplied to summer 309 to adjust the current flowing to section 2. Accordingly, the refractive index of section 2 is tuned to a point which coincides with a minimum of the loss envelope $\alpha_{th}(\lambda)$. This is easily understood by realizing that the output power of the laser is lowered when the Fabry-Perot mode wavelengths drift with respect to the loss envelope minimum.

Figure 4:
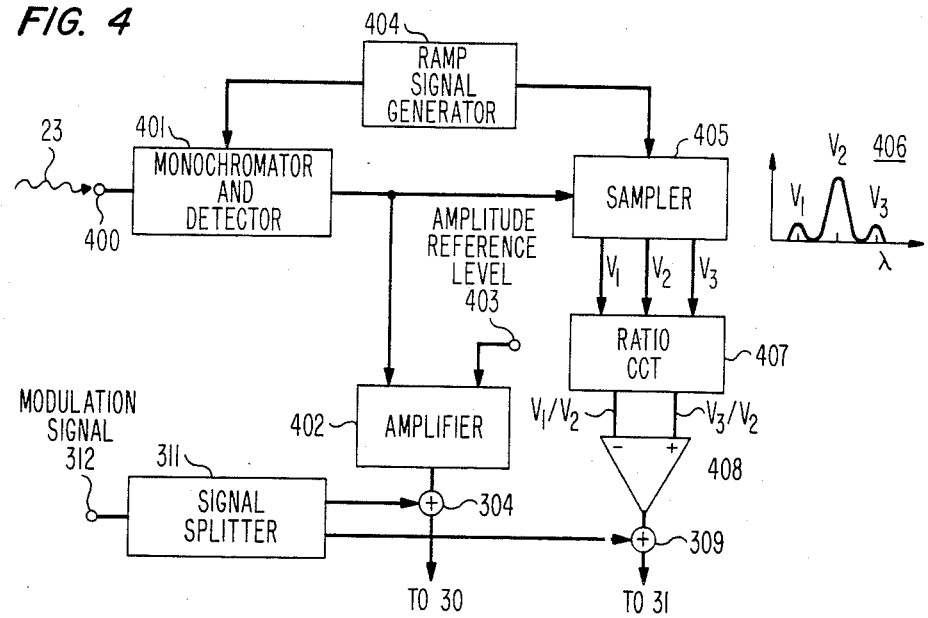

FIG. 4 shows an alternative feedback control circuit for controlling the output spectrum of the coupled-cavity laser. This feedback control circuit also has two circuit paths: a first circuit path which includes monochromator and detector 401, ramp signal generator 404, amplifier 402, summer 304 and signal splitter 311; the second signal path includes ramp signal generator 404, monochromator and detector 401, sampler 405, a ratio forming circuit 407, differential amplifier 408, summer 309 and signal splitter 311. As in the previous feedback control circuit, a modulation signal is applied to terminal 312 of signal splitter 311 and the output of signal splitter 311 is supplied to summers 304 and 309. An output signal from an end mirror facet of the laser, in this example output signal 23 from mirror facet 21 of section 2, is supplied to optical fiber terminal 400 of monochromator and detector 401. Monochromator and detector 401 is scanned over the band of interest for the laser output signal by a low frequency output signal from ramp signal generator 404 in order to produce smoothed output spectrum signal 406. The low frequency signal output by ramp signal generator 404 is, for example, a triangular wave signal or a sawtooth signal or a ramp type of signal having an amplitude related to the bandwidth of the laser output signal to be scanned in producing spectrum 406 and a period intermediate to an expected drift time and the period of the modulation current. Spectrum signal 406 is supplied to sampler 405 and to amplifier 402.

Continuing along the first circuit path, spectrum signal 406 is compared to amplitude reference level from terminal 403 by amplifier 402. Amplifier 402 generates an output signal which is used to control the bias current for section 1. The time constant for this path must be less than the period of the signal from ramp generator 404 so that all spectral components are summed.

In the second circuit path, sampler 405 is a sample and hold circuit which measures the amplitude of at least the main mode $V_2$ and the two sides $V_1$ and $V_3$. These three amplitudes are output to a ratio forming circuit 407 to generate the amplitude ratios of the side modes to the main mode, namely, $V_1/V_2$ and $V_3/V_2$. Both amplitude ratios are provided to the input of differential amplifier 408 for generating an output signal representing the direction of shift in the modes of the laser. The output signal from differential amplifier 408 is input to summer 309 to adjust and control the refractive index of section 2. Time constants for the two circuit paths are determined primarily by the period of the output signal from ramp signal generator 404.

When the coupled cavity laser is operating in a continuous (FM) or discrete (FSK) frequency modulation regime, it is desirable to adjust modulation signal levels supplied to each section via signal splitter 311. This is easily accomplished by utilizing relative wavelength information developed by monochromator and detector 401 together with sampler 405.

Figure 5:
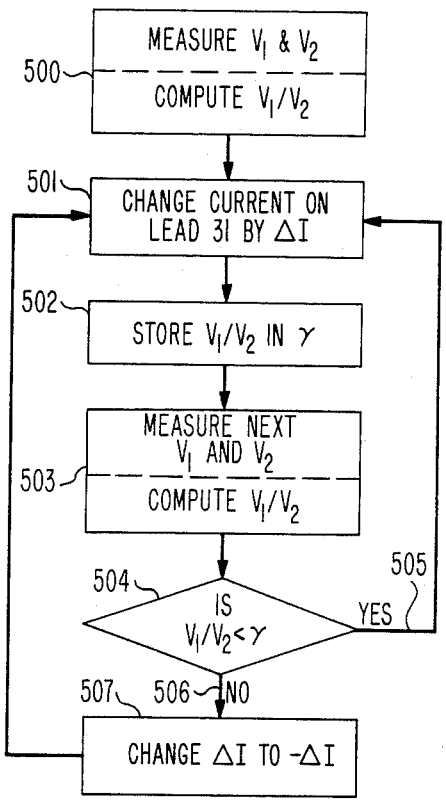
FIG. 5 is a flowchart for adapting a portion of the circuit shown in FIG. 4 to microcomputer implementation.

FIG. 5 is a flowchart of a process capable of being implemented in VLSI circuit or on a microcomputer for carrying out functions similar to those performed by sampler 405, ratio forming circuit 407 and amplifier 408 in the feedback control circuit of FIG. 4. Operational block 500 measures the amplitude of the main mode $V_2$ and the amplitude of a side mode, for example, $V_1$. Subsequently, a ratio is formed between the side mode amplitude and the main mode amplitude, $V_1/V_2$. Operational block 501 causes the current through summer 309 on lead 31 to be changed by an amount $\Delta I$. Operational block 502 causes the side mode to main mode ratio from operational block 500 to be stored in register $\gamma$. Operational block 503 measures the next set of main and side mode amplitudes and computes a new side mode amplitude to main mode amplitude ratio. Control is then transferred to conditional branch point 504. At conditional branch point 504, the latest side mode amplitude to main mode amplitude ratio is compared to the contents of register $\gamma$. If the ratio is less than $\gamma$, then control is transferred on YES path 505 to operational block 501. However, if the ratio is greater than $\gamma$, then control is transferred to operational block 507 along NO path 506. Operational block 507 causes the current value ΔI to be permanently inverted and then causes the current supplied to lead 31 via summer 309 to be changed by the new amount ΔI. Control is then returned to operational block 501.

Figure 6:
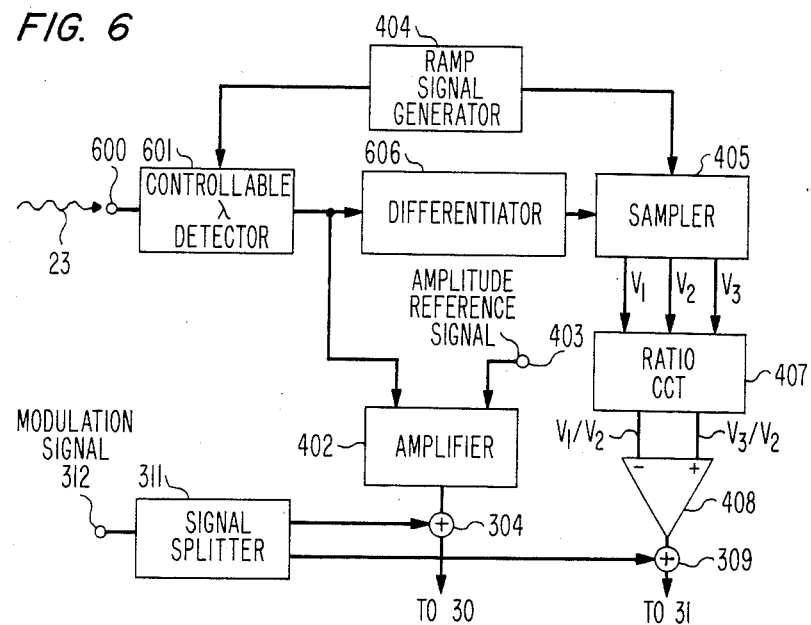

FIG. 6 shows a feedback control circuit for controllably varying the refractive indices of sections 1 and 2 of the coupled-cavity laser. This feedback control circuit also includes first and second circuit paths for controlling the current supplied to sections 1 and 2, respectively. The first circuit path includes a controllable wavelength detector 601, ramp signal generator 404, amplifier 402, signal splitter 311, and summer 304. The second circuit path includes controllable wavelength detector 601, differentiator 606, ramp signal generator 404, sampler 405, ratio forming circuit 407, amplifier 408, summer 309 and signal splitter 311. Many of the circuit path elements have been described in relation to other FIGURES and that description will not be repeated herein.

Controllable wavelength detector 601 receives light output signal 23 from the laser via optical fiber input terminal 600. The controllable wavelength detector 601 is controlled to vary its absorption characteristic in response to a sweep signal such as the output signal generated by ramp signal generator 404. This is accomplished by the Franz-Keldysh effect. In effect, controllable wavelength detector 601 integrates from a variable cutoff wavelength across all longer wavelengths of the light signal from the laser. The output from controllable wavelength detector 601 is supplied to amplifier 402 and to differentiator 606. Amplifier 402 compares the amplitude of the output signal from controllable wavelength detector to a reference level at terminal 403 and, in turn, generates a current signal to adjust the refractive index of section 1.

Differentiator 606 generates an output signal which represents the first derivative of its input signal. The output from differentiator 606 is substantially equal to the spectrum of light output signal 23. Differentiator 606 is connected to sampler 405 which generates main and side mode amplitudes to be used by ratio forming circuit 407. Sampler 405, ratio forming circuit 407, differential amplifier 408 and summer 309 have been described above in relation to FIGS. 3 and 4.

Figure 7:
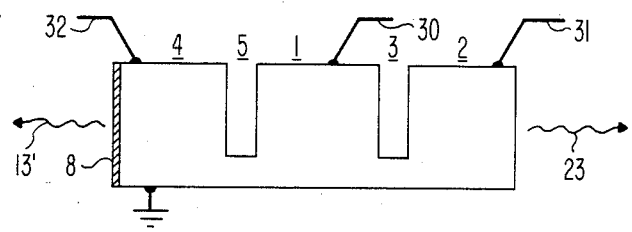
FIGS. 7, 8 and 9 show the addition of a modulator cavity section or a detector cavity section or both to the laser shown in FIG. 1.

FIG. 7 shows a monolithic three section, coupled-cavity semiconductor laser in which the third section comprises a modulator (amplifier) section 4 separated from section 1 by gap 5. Section 4 is electronically controlled by a modulation current signal applied to terminal electrode 32. The modulation current signal is substantially identical to the signal at input terminal 312 of signal splitter 311 (FIGS. 3, 4, and 6). Thin film anti-reflection coating 8 is deposited on an end mirror facet of section 4 to decouple sections 1 and 4 by preventing unwanted optical feedback from section 4 to section 1. One advantage of a separate modulator (amplifier) section is that light output signal 13' can be at a higher output power than light output signal 13 because section 4 is operated below the saturation level of its gain characteristic. Also mode purity is more easily maintained when less modulation is applied to terminal electrodes 30 and 31.

Figure 8:
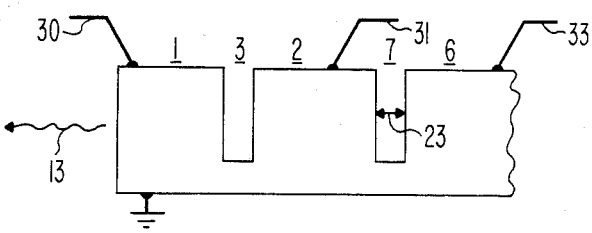

FIG. 8 is also a monolithic three section device which includes detector section 6 separated from section 2 by gap 7. The photocurrent generated by section 6 can be sensed at terminal electrode 33. Alternatively, sweep signals such as those generated by ramp signal generator 404 can be input to the detector on terminal electrode 33.

Figure 9:
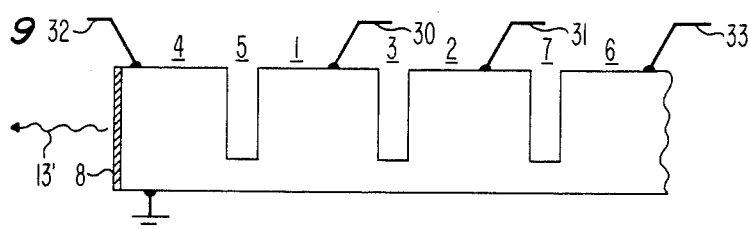

FIG. 9 shows the combination of modulator (amplifier) section 4 and detector section 6 with laser sections 1 and 2 to form a monolithic four section device.

Figure 10:
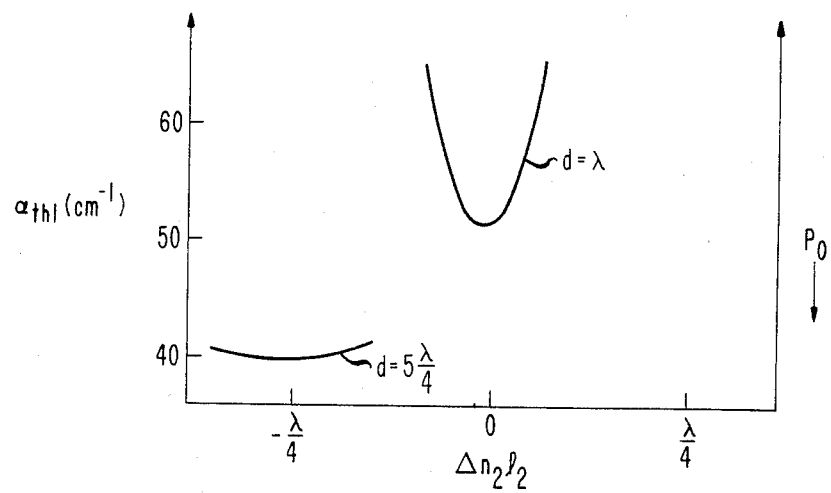
FIG. 10 shows graphically the relationship of the gap length, d, to the performance of a particular coupled-cavity laser as shown in FIG. 1.

FIG. 10 shows the effects of an optical length shift for section 2, $\Delta n_2 l_2$, on the coupled-cavity laser performance for two different lengths of gap 3. These two curves correspond to the case where $l_1 >> l_2$ and $l_1/l_2 \sim 7$. Similar curves are calculated for the case where the cavity section lengths are substantially equal. As shown in FIG. 10, when the gap length is an odd integer multiple of the laser quarter wavelength (e.g., $d = 5 \lambda/4$) and the loss envelope $\alpha_{th}(\lambda)$ is at a minimum (section 2 is anti-resonant), a change in $\Delta(n_2 l_2)$ has little effect on output power $P_o$. Also, an increase of the gain to section 2 to improve the finesse decreases spurious mode selectivity since section 2 is anti-resonant at the loss minimum. On the other hand, when the gap length is an even integer multiple of the laser quarter wavelength (e.g., $d = \lambda$) and the loss envelope $\alpha_{th}(\lambda)$ is at a minimum (section 2 is resonant), a change in $\Delta(n_2 l_2)$ has a large effect on $P_o$ and enhances the operation of the above-described control arrangement. Also, an increase in the gain of section 2 produces substantially better mode discrimination since section 2 is resonant at the minimum of $\alpha_{th}(\lambda)$. Hence, proper design or adjustment of gap length d increases both the variation of output power $P_o$ versus $\Delta(n_2 l_2)$ and the loss margin $\Delta\alpha_1$, which enhances adjacent mode discrimination for the coupled-cavity laser. These results are important to the initial fabrication of gap 3 and to the subsequent controlled adjustment of the gap length, if necessary or desired.

Figure 11:
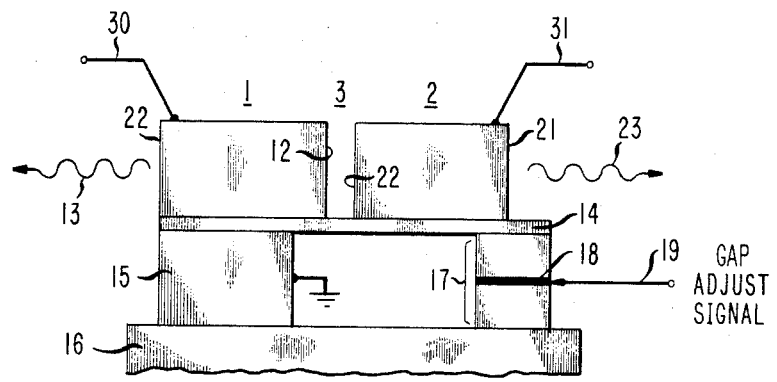
FIG. 11 shows a circuit for dynamically varying the gap length, d, of a coupled-cavity laser.

FIG. 11 shows an exemplary embodiment of a laser device adapted for adjustment of the intercavity gap length for gap 3. Sections 1 and 2 of the laser are mounted on adjustable mounting platform 14 which is a thin, flexible, electrically conductive material such as phosphor bronze which is also a heat sink material. Separation layer 15 extends under only a portion of the coupled-cavity laser. As shown in this FIGURE, separation layer 15 is under a portion of section 1 but does not extend under gap 3. Heat sink 16 is the heat sink and structural support for the entire device shown if FIG. 11. Separation layer 15 is securely attached to adjustable mounting platform 14 and to heat sink 16. Both separation layer 15 and heat sink 16 are comprised of electrically conductive, heat sinking material such as copper. Gap adjustment element 17 located under section 2 away from gap 3 is responsive to a relatively small amplitude dc gap adjustment signal on lead 19 for displacing adjustable mounting platform 14 with respect to heat sink 16 to increase or decrease gap length d. Gap adjustment element 17 is in electrical contact with adjustable mounting platform 14 and heat sink 16. Gap adjustment element 17 is comprised of a stack of alternating polarity piezoelectric material layers and a contact layer 18 sandwiched between piezoelectric stack layers of opposite polarity.

An alternative embodiment of the device shown in FIG. 11 includes a micrometer adjusting screw in place of gap adjustment element 17 for providing mechanical displacement of adjustable mounting platform 14 with respect to heat sink 16 in order to change gap length d of gap 3.

Figure 12:
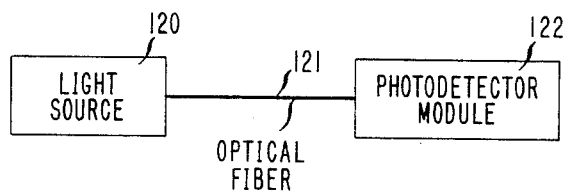
FIG. 12 shows a simplified block diagram for a fiber optic communication system in accordance with the present invention.

FIG. 12 is a simple schematic diagram depicting a fiber optic communication system in accordance with the principles of this invention. The system includes light source 120, optical fiber 121, and photodetector module 122. Light source 120 is comprised of at least one spectrally controllable coupled-cavity semiconductor laser as described above. Light source 120 and photodetector module 122 are optically coupled to each other by means of optical fiber 121. Optical fiber 121 may comprise any of the conventional multimode or single mode silica-based fibers. Since the coupled-cavity semiconductor laser is controlled to generate and maintain a single longitudinal mode in accordance with this invention, the type of fiber employed in the system, i.e., single mode or multimode, will not seriously degrade the spectrum of signal received by photodetector module 122.

Although section 2 has been described as being an element of the laser, section 2 can be viewed as an additional element of the control arrangement such as is shown in FIGS. 3 or 4 or 6. Furthermore, the coupled-cavity laser can be comprised of more cavity sections than the two shown in FIG. 1.

While it has been assumed for purposes of illustration and not for purposes of limitation that section 1 is biased above threshold and section 2 is biased below threshold, it is also possible and, in fact, desirable in certain applications to bias both sections above threshold. Also, detection of the laser output signal is not limited to being from the end mirror facet of section 2 as shown in the FIGURES. Detection may be accomplished also from the end facet of section 1.

It will be appreciated by those skilled in the art that the spectral control arrangements described above are useful not only for stabilizing and maintaining control of a coupled-cavity laser to generate a single longitudinal mode output but also for sweeping (chirping) the wavelength of a Fabry-Perot mode (frequency modulation) or for hopping controllably from one Fabry-Perot mode to another (frequency shift keying).

What is claimed is:

1. A semiconductor device comprised of
a first heterostructure section including first and second mirror facets, a plurality of semiconductor layers capable of generating a light output signal in response to an applied electrical signal, and first electrode means connected to the heterostructure section for receiving electrical signals applied to the plurality of semiconductor layers, and
control means responsive to the light output signal, said control means being optically coupled to the first heterostructure section through the first mirror facet and connected to the first electrode means, for generating an optical control signal mutually and optically coupled with the first mirror facet of the first heterostructure section and for generating a first electrical control signal which is supplied to the first electrode means, so that the light output signal exhibits substantially a single longitudinal mode.

2. The semiconductor device as defined in claim 1 wherein a gap of length d is located between the first mirror facet of the first heterostructure section and the control means.

3. The semiconductor device as defined in claim 2 wherein the length d of the gap is substantially equal to an even number of quarter wavelengths of the light output signal.

4. The semiconductor device as defined in claim 1 wherein the control means includes control circuit means responsive to the light output signal for generating first and second electrical control signals, and
a second heterostructure section including first and second mirror facets, a plurality of semiconductor layers having an effective index of refraction which is capable of being varied in response to the second electrical control signal, and second electrode means connected to the second heterostructure section for receiving electrical signals including the second electrical control signal applied to the plurality of semiconductor layers, the second heterostructure section being mutually and optically coupled to the first heterostructure section.

5. The semiconductor device as defined in claim 4 wherein the control circuit means further includes means for dividing a modulation signal into a first predetermined portion capable of being applied to the first electrode means and into a second predetermined portion capable of being applied to the second electrode means.

6. The semiconductor device as defined in claim 4 wherein a gap of length d is located between the first mirror facet of the first heterostructure section and the first mirror facet of the second heterostructure section.

7. The semiconductor device as defined in claim 6 wherein the control means includes means for displacing at least the second heterostructure section to adjust the length of the gap.

8. The device as defined in claim 1 wherein the control means generates optical and electrical control signals for shifting a Fabry-Perot mode of the light output signal to a predetermined wavelength in a group of at least two wavelengths.

9. The device as defined in claim 4 wherein the first heterostructure section has length $l_1$ and the second heterostructure section has length $l_2$.

10. The device as defined in claim 9 wherein $l_2 \leq 40$ and $l_1 >> l_2$.

11. The device as defined in claim 10 wherein the lengths of the first and second heterostructure sections are related as $l_1/l_2 \leq 20$.

12. The device as defined in claim 9 wherein the difference between the length of the first heterostructure section and the length of the second heterostructure section is less than or equal to 40 microns.

13. The device as defined in claim 12 wherein the lengths of the first and second heterostructure sections are related as $l_1/(l_1 - l_2) \leq 20$.

14. A semiconductor device comprised of
a first heterostructure section including first and second mirror facets, a plurality of semiconductor layers capable of generating a light output signal in response to an applied electrical signal, and first electrode means connected to the heterostructure section for receiving electrical signals applied to the plurality of semiconductor layers, and
control means responsive to the light signal, said control means being optically coupled to the first heterostructure section through the first mirror facet and connected to the first electrode means, for generating an optical control signal mutually and optically coupled with the first mirror facet of the first heterostructure section and for generating a first electrical control signal which is supplied to the first electrode means, so that a ratio between a main mode and an adjacent mode of the light output signal is substantially maximized.

15. A fiber optic communication system including at least a first light source for generating a light output signal, an optical fiber connected to the light source, and at least a first photodetector means coupled to the optical fiber for receiving the light output signal, the at least first light source being comprised of, a first heterostructure section including first and second mirror facets, a plurality of semiconductor layers capable of generating a light output signal in response to an applied electrical signal, and first electrode means connected to the heterostructure section for receiving electrical signals applied to the plurality of semiconductor layers, and control means responsive to the light output signal, said control means being optically coupled to the first heterostructure section through the first mirror facet and connected to the first electrode means, for generating an optical control signal mutually and optically coupled with the first mirror facet of the first heterostructure section and for generating a first electrical control signal which is supplied to the first electrode means, so that the light output signal exhibits substantially a single longitudinal mode.

16. The fiber optic communication system as defined in claim 15 wherein a gap of length d is located between the first mirror facet of the first heterostructure section and the control means.

17. The fiber optic communication system as defined in claim 16 wherein the length d of the gap is substantially equal to an even number of quarter wavelengths of the light output signal.

18. The fiber optic communication system as defined in claim 15 wherein the control means includes control circuit means responsive to the light output signal for generating first and second electrical control signals, and a second heterostructure section including first and second mirror facets, a plurality of semiconductor layers having an effective index of refraction which is capable of being varied in response to the second electrical control signal, and second electrode means connected to the second heterostructure section for receiving electrical signals including the second electrical control signal applied to the plurality of semiconductor layers, the second heterostructure section being optically coupled to the first heterostructure section.

19. The semiconductor device as defined in claim 18 wherein the control circuit means further includes means for dividing a modulation signal into a first predetermined portion capable of being applied to the first electrode means and into a second predetermined portion capable of being applied to the second electrode means.

20. The fiber optic communication system as defined in claim 18 wherein a gap of length d is located between the first mirror facet of the first heterostructure section and the first mirror facet of the second heterostructure section.

21. The fiber optic communication system as defined in claim 20 wherein the control means includes means for displacing at least the second heterostructure section to adjust the length of the gap.

22. The system as defined in claim 15 wherein the control means generates optical and electrical control signals for shifting a Fabry-Perot mode of the light output signal to a predetermined wavelength in a group of at least two wavelengths.

23. The system as defined in claim 18 wherein the first heterostructure section has length $l_1$ and the second heterostructure section has length $l_2$.

24. The system as defined in claim 23 wherein $l_2 \leq 40$ microns and $l_1 >> l_2$.

25. The system as defined in claim 24 wherein the lengths of the first and second heterostructure sections are related as $l_1/l_2 \leq 20$.

26. The system as defined in claim 23 wherein the difference between the length of the first heterostructure section and the length of the second heterostructure section is less than or equal to 40 microns.

27. The system as defined in claim 26 wherein the lengths of the first and second heterostructure sections are related as $l_1/(l_1-l_2) \leq 20$.

28. A semiconductor device comprised of a first heterostructure section including first and second mirror facets, a plurality of semiconductor layers capable of generating a light output signal in response to an applied electrical signal, and first electrode means connected to the heterostructure section for receiving electrical signals applied to the plurality of semiconductor layers, and control means responsive to the light output signal, said control means being optically coupled to the first heterostructure section and connected to the first electrode means, for stabilizing the light output signal to be at a predetermined wavelength substantially in a single longitudinal mode by generating an optical control signal mutually and optically coupled with the first mirror facet and by generating a first electrical control signal to be supplied to the first electrode means.

29. The device as defined in claim 28 wherein the control means generates optical and electrical control signals for shifting a Fabry-Perot mode of the light output signal to a predetermined wavelength in a group of at least two wavelengths.

30. The semiconductor device as defined in claim 28 wherein the control means includes control circuit means responsive to the light output signal for generating first and second electrical control signals, and a second heterostructure section including first and second mirror facets, a plurality of semiconductor layers having an effective index of refraction which is capable of being varied in response to the second electrical control signal, and second electrode means connected to the second heterostructure section for receiving electrical signals including the second electrical control signal applied to the plurality of semiconductor layers, the second heterostructure section being mutually and optically coupled to the first heterostructure section.

31. The semiconductor device as defined in claim 30 wherein the control circuit means further includes means for dividing a modulation signal into a first predetermined portion capable of being applied to the first electrode means and into a second predetermined portion capable of being applied to the second electrode means.

32. The device as defined in claim 30 wherein the first heterostructure section has length $l_1$ and the second heterostructure section has length $l_2$.

33. The device as defined in claim 32 wherein $l_2 \leq 40$ microns and $l_1 >> l_2$.

34. The device as defined in claim 33 wherein the lengths of the first and second heterostructure sections are related as $l_1/l_2 \leq 20$.

35. The device as defined in claim 32 wherein the difference between the length of the first heterostructure section and the length of the second heterostructure section is less than or equal to 40 microns.

36. The device as defined in claim 35 wherein the lengths of the first and second heterostructure sections are related as $l_1/(l_1-l_2) \leq 20$.

* * * * *